(12) United States Patent
Hosier et al.

(10) Patent No.: US 8,129,258 B2
(45) Date of Patent: Mar. 6, 2012

(54) METHOD FOR DICING A SEMICONDUCTOR WAFER, A CHIP DICED FROM A SEMICONDUCTOR WAFER, AND AN ARRAY OF CHIPS DICED FROM A SEMICONDUCTOR WAFER

(75) Inventors: Paul A. Hosier, Rochester, NY (US); Nicholas J. Salatino, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 12/646,590

(22) Filed: Dec. 23, 2009

(65) Prior Publication Data
US 2011/0147898 A1 Jun. 23, 2011

(51) Int. Cl.
*H01L 21/00* (2006.01)
(52) U.S. Cl. ......................... 438/460; 438/463
(58) Field of Classification Search .................. None
See application file for complete search history.

(56) References Cited

U.S. PATENT DOCUMENTS

| | | | |
|---|---|---|---|
| 4,814,296 A * | 3/1989 | Jedlicka et al. | 438/68 |
| 4,860,075 A | 8/1989 | Araghi et al. | |
| 5,128,282 A * | 7/1992 | Ormond et al. | 438/68 |
| 5,153,421 A | 10/1992 | Tandon et al. | |
| 5,580,831 A * | 12/1996 | Roman | 83/862 |
| 5,753,959 A | 5/1998 | Quinn et al. | |
| 7,498,238 B2 | 3/2009 | Tamura | |
| 2007/0207594 A1 * | 9/2007 | Tamura | 438/463 |

* cited by examiner

*Primary Examiner* — Ha Tran T Nguyen
*Assistant Examiner* — Shantanu C Pathak
(74) *Attorney, Agent, or Firm* — Simpson & Simpson, PLLC

(57) ABSTRACT

A method for dicing a semiconductor wafer, including: cutting a reference slot in a back main surface of the wafer; cutting a back slot in the back main surface, the back slot positioned with respect to the reference slot; determining a desired location for a chip edge with respect to the reference slot; and applying radiant energy in a path such that a series of reformed regions are formed within the wafer along the path. A crystalline structure of the wafer is modified in the series of reformed regions and an alignment of an edge of the laser is with respect to the desired location for the chip edge and in alignment with the back slot. The method includes separating the wafer along the series of reformed regions to divide portions of the wafer on either side of the series of reformed regions.

14 Claims, 8 Drawing Sheets

METHOD FOR DICING A SEMICONDUCTOR WAFER, A CHIP DICED FROM A SEMICONDUCTOR WAFER, AND AN ARRAY OF CHIPS DICED FROM A SEMICONDUCTOR WAFER

TECHNICAL FIELD

The present disclosure relates to a method for dicing a semiconductor wafer, a chip diced from a semiconductor wafer, and an array with chips diced from a semiconductor wafer, in particular, dicing using radiant energy, even more particularly, using a laser.

BACKGROUND

Multi-chip arrays are used in many image-related applications, for example, for scanning, copying, or printing operations. As an example, photosensor chips for scanning document images can be placed in a row to form a linear array. Suitable supporting circuitry for the array is integrated onto a silicon chip. A typical architecture for such an array is given, for example, in commonly-owned U.S. Pat. No. 5,153,421.

High precision, low damage dicing or scribing is needed on the ends of chips that are used in linear multi-chip arrays in which the chips are "butted" or placed end-to-end to maintain a desired spacing between the chips. For example, for butted photosensor chips, if sensors on the chips are spaced "x" amount apart, the desired spacing between two butted chips is such that the respective sensors closest to the butted ends are spaced "x" amount from each other to maintain the sensor spacing on the chips. That is, the on-chip sensor spacing is preserved across the joint of the butted chips.

FIG. 7 is a representation of a prior art method of dicing a wafer. The prior art teaches the use of a mechanical blade to dice a wafer to form chips, or dies. For example, commonly-owned U.S. Pat. No. 4,814,296 teaches cutting a slot in a back surface of a wafer with a blade and then cutting through the wafer from the front side with a blade. As shown in FIG. 7, the cut on the front side is aligned to be within a width of the back slot. To neutralize mechanical stresses, for example, cracking, due to the sawing process, U.S. Pat. No. 4,814,296 teaches the use of an additional step of etching the front surface to form a groove in which the front cut is made.

U.S. Pat. No. 7,498,238, teaches the use of a blade to partially notch a wafer and the use of a laser to generate reformed layers in a silicon cap portion added to the wafer to protect a construction on the wafer, for example, a sensor or a micro machine. The composite structure of the wafer and cap portion is stressed to generate cracks between the reformed layers to separate portions of the composite structure. The laser is not used to cut or generate reformed layers in the wafer itself.

SUMMARY

According to aspects illustrated herein, there is provided a method for dicing a semiconductor wafer, including: cutting a reference slot in a back main surface of the wafer; cutting a back slot in the back main surface of the wafer, the back slot positioned with respect to the reference slot; determining a desired location for a first chip edge with respect to the reference slot; and applying radiant energy in a first path such that a first series of reformed regions are formed within the wafer along the first path. A crystalline structure of the wafer is modified in the first series of reformed regions and an alignment of a first edge of the laser is with respect to the desired location for the first chip edge and in alignment with the back slot. The method includes separating the wafer along the first series of reformed regions to divide portions of the wafer on either side of the first series of reformed regions.

According to aspects illustrated herein, there is provided a method for dicing a semiconductor wafer, including: cutting a reference slot in a back main surface of the wafer; cutting a back slot in the back main surface of the wafer, the back slot positioned with respect to the reference slot; determining a desired location for a first chip edge with respect to the reference slot; and applying radiant energy in a first path such that a first series of reformed regions are formed within the wafer along the first path. A crystalline structure of the wafer is modified in the first series of reformed regions and an alignment of a first edge of the laser is with respect to the desired location for the first chip edge and in alignment with the back slot. The method includes determining a desired location for a second chip edge with respect to the reference slot; and applying radiant energy in a second path such that a second series of reformed regions are formed within the wafer along the second path. The crystalline structure of the wafer is modified in the second series of reformed regions and an alignment of a second edge of the laser is with respect to the desired location for the second chip edge; and in alignment with the back slot. The method includes separating the wafer along the first and second series of reformed regions to divide portions of the wafer on either side of the first and second series of reformed regions.

According to aspects illustrated herein, there is provided a method for dicing a semiconductor wafer, including: cutting a reference slot in a back main surface of the wafer; cutting a back slot in the back main surface of the wafer, the back slot positioned with respect to the reference slot; determining a desired location for a chip edge with respect to the reference slot; and applying radiant energy in a path such that a series of reformed regions are formed within the wafer along the path. A crystalline structure of the wafer is modified in the reformed regions and an alignment of an edge of the laser is with respect to the desired location for the chip edge and in alignment with the back slot. The method includes separating the wafer along the series of reformed regions to divide portions of the wafer on either side of the series of reformed regions.

According to aspects illustrated herein, there is provided a semiconductor chip, including: front and back main surfaces and an end surface formed between the front and back main surfaces. The end surface includes a substantially planar portion in communication with the front and back main surfaces and a plurality of substantially periodically spaced and equally sized indentations. A respective circumference for each indentation is fully surrounded by the planar portion.

BRIEF DESCRIPTION OF THE DRAWINGS

Various embodiments are disclosed, by way of example only, with reference to the accompanying schematic drawings in which corresponding reference symbols indicate corresponding parts, in which.

DETAILED DESCRIPTION

Figure 1:
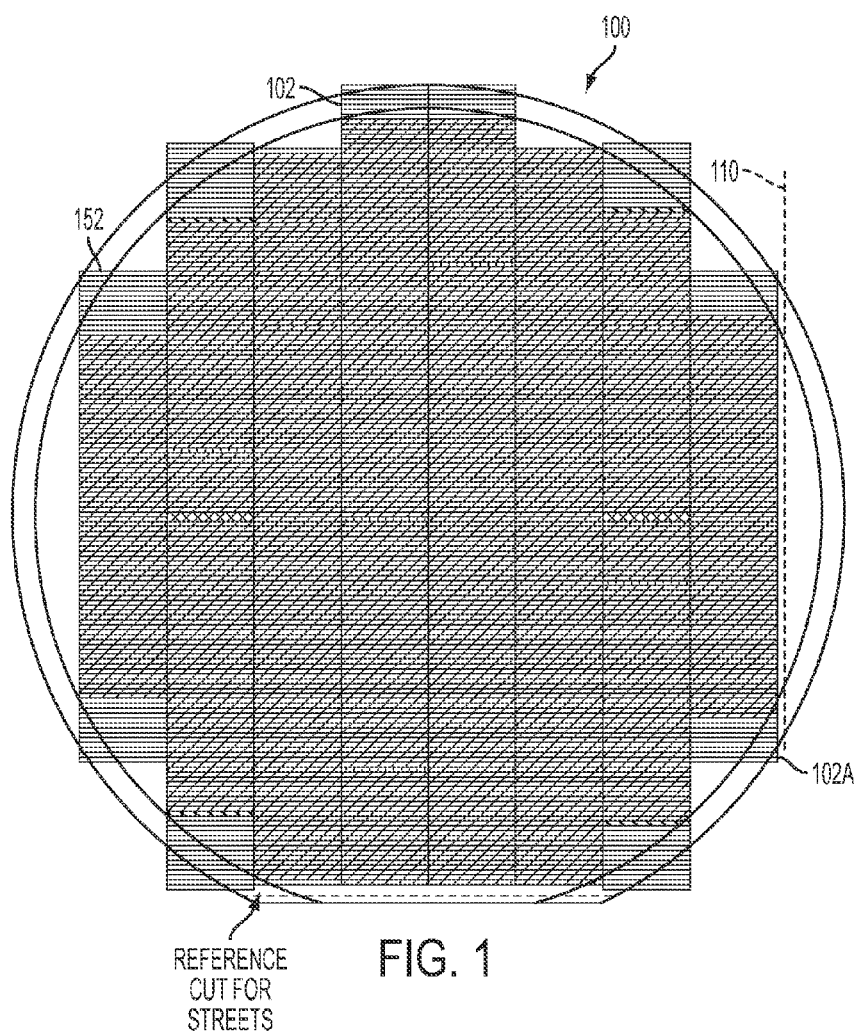
FIG. 1 is a typical wafer map for a semiconductor wafer to be diced into chips.

FIG. 1 is a typical wafer map for semiconductor, for example, silicon, wafer 100 to be diced into chips. Wafer 100 can be any semiconductor wafer known in the art. The terms "die" and "chip" are considered interchangeable; however in the discussion that follows, the term "chip" is used. FIG. 1 shows a typical semiconductor wafer layout, with the array chips, for example, sensor chips, to be diced by horizontal and vertical cutting of the wafer. As noted supra, high precision, low damage dicing or scribing is needed on the ends of chips to be used in linear multi-chip arrays in which the chips are "butted" or placed, to maintain a desired spacing between the chips. To maintain the desired inter-chip spacing, the chips must be diced within a certain tolerance. In an example embodiment, photosensor chips need to be cut to a tolerance of about +/−3 micrometers (um). In addition, a minimum width must be maintained for a vertical scribe line, or vertical street, 102. In an example embodiment, the width is 80 ums, although other widths are possible. The minimum width is needed for monitor and alignment structures required by the wafer foundry to process the wafers.

Figure 2:
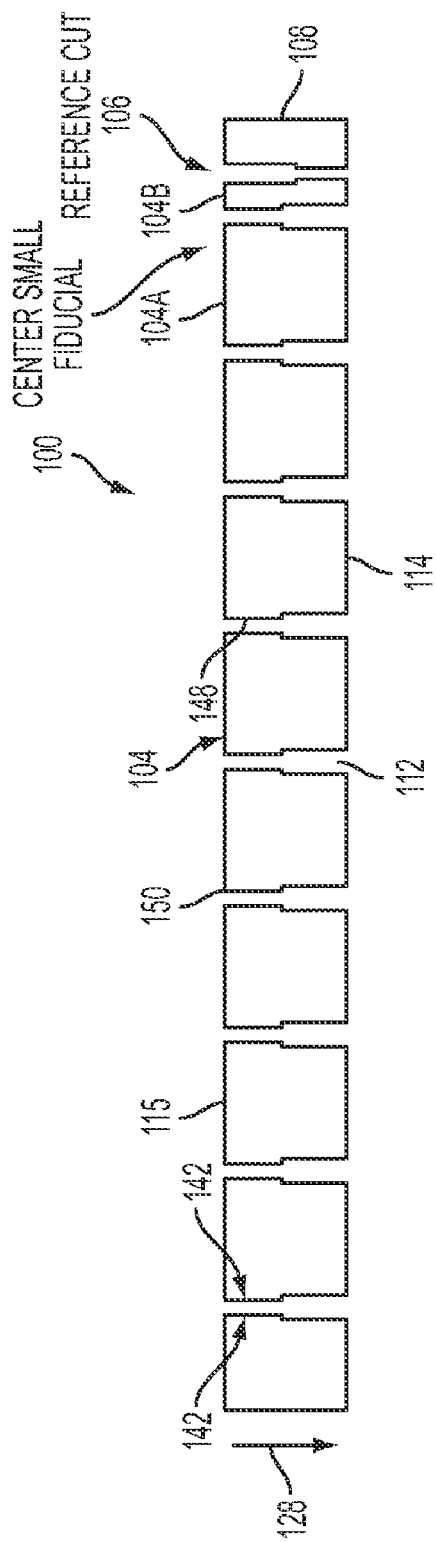
FIG. 2 is a cross-sectional view of a plurality of chips diced from a semiconductor wafer using a combination of blade sawing and radiant energy.

FIG. 2 is a cross-sectional view of plurality of chips 104 diced from semiconductor wafer 100 using a combination of blade sawing and radiant energy. The following should be viewed in light of FIGS. 1 and 2. In an example embodiment, a laser is used to produce the radiant energy. In the discussion that follows, a laser and a laser beam are used as examples of a radiant energy source; however, it should be understood that the production of radiant energy is not limited to a laser. Reference slot 106 is cut in portion 108 of the wafer outside of the portion of the wafer to be diced into chips, for example, in FIG. 1, the area bounded by vertical scribe line 102A and line 110. In an example embodiment, reference slot 106 is cut in back main surface 114 of the wafer. Any means known in the art, for example, sawing with a blade, can be used to make the reference cut. In an example embodiment, reference slot 106 is cut in front main surface 115 of the wafer for use with respect to fiducial front cuts. Any means known in the art, for example, sawing with a blade, can be used to make the reference cut.

Back slots, or back cuts 112 are cut into back surface 114 of the wafer. In an example embodiment, the back cuts are made with a blade. As further described below, radiant energy, for example, a laser, is used to create reformed regions. Reformed regions are further described infra. The wafer is separated along the reformed regions to divide portions of the wafer and form chips 104. As further described below, the back slots and reformed regions are positioned, or located, with respect to the reference cut, as is known in the art. In an example embodiment, the back slots and reformed regions are positioned with respect to a known location, for example, a fiducial, as is known in the art.

Figure 3:
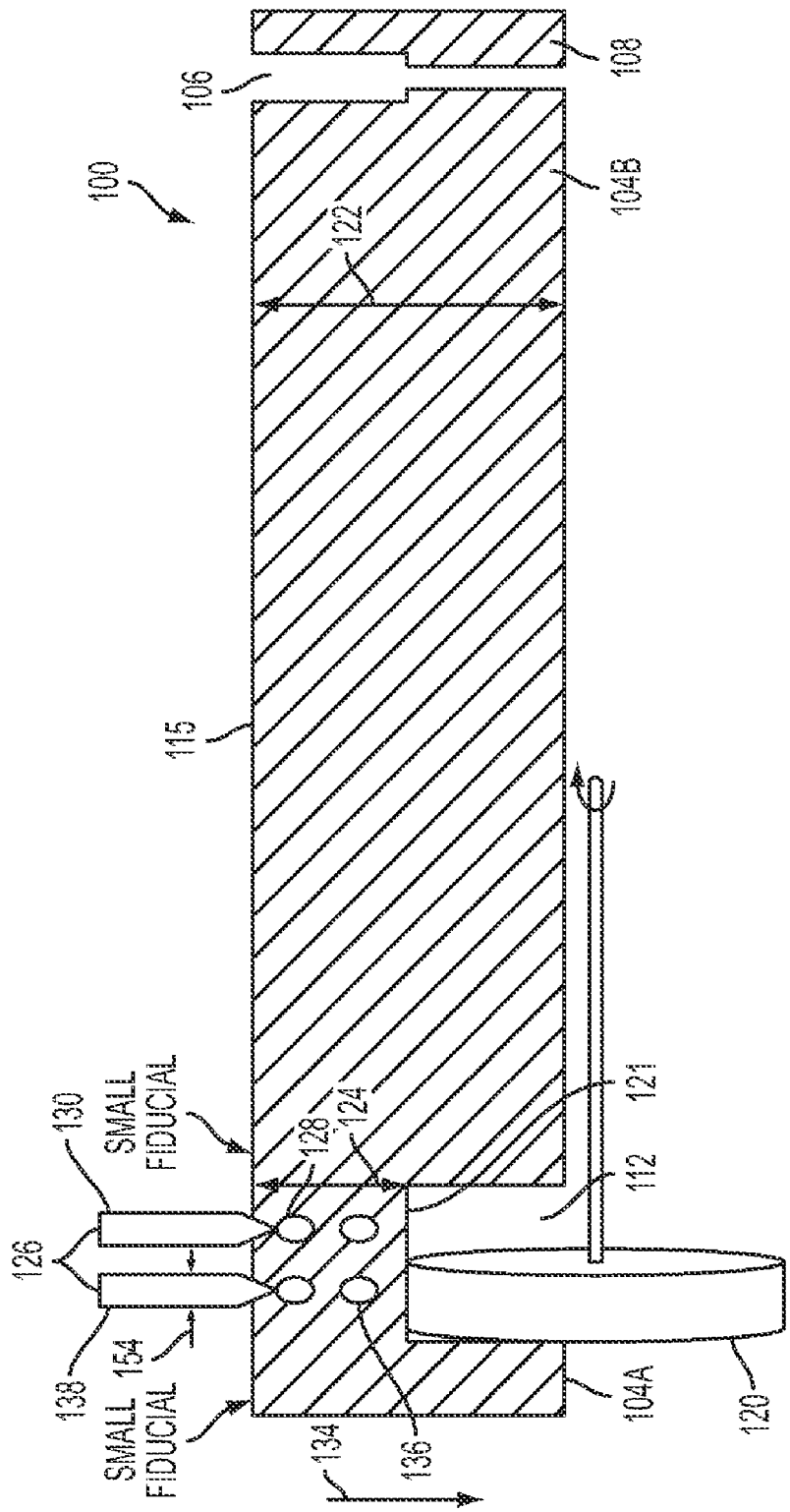
FIG. 3 is a pictorial representation showing dicing of a portion of FIG. 2 using a combination of blade sawing and radiant energy.

FIG. 3 is a pictorial representation showing dicing of a portion of FIG. 2, formed by chip 104B and part of chip 104A, using a combination of blade sawing and radiant energy. In an example embodiment, the backside cuts are formed by a single pass or dual pass of blade 120, depending on the blade thickness and the back cut width needed. In an example embodiment, a larger back cut width helps with several tolerances related to "butted" assembly, for example, contact image sensor array assembly. In an example embodiment, the back cuts enable laser dicing. Slot 112 includes slot surface 121 substantially parallel to surface 115. For example, radiant energy, such as a laser, may not be effective at full thickness 122 for the wafer; however, the laser may be usable at reduced thickness 124 between surfaces 115 and 121. In an example embodiment, thickness 124 is about 200-300 um.

Figure 4:
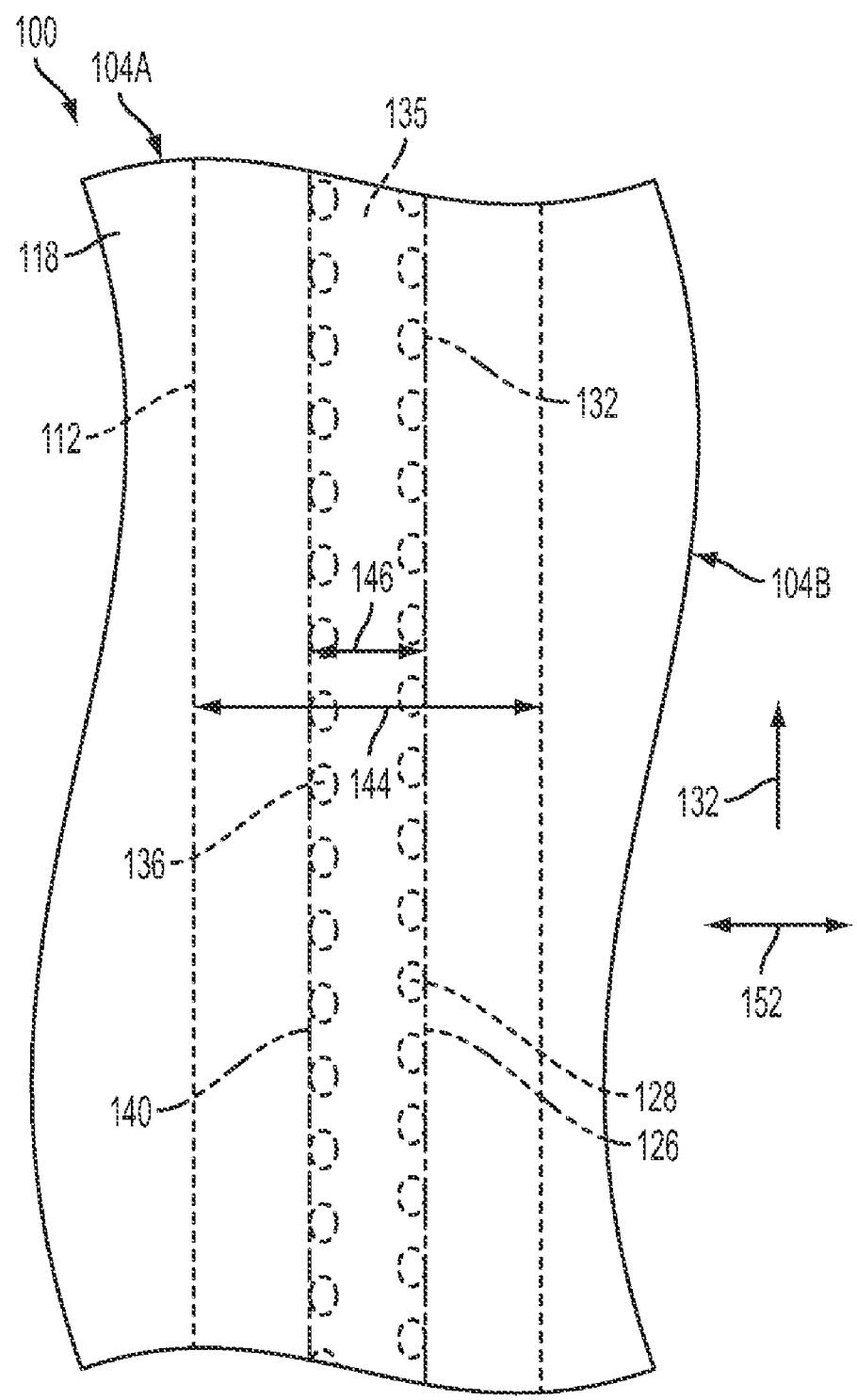
FIG. 4 is a plan view of the portion shown in FIG. 3.

FIG. 4 is a plan view of the portion shown in FIG. 3. The following should be viewed in light of FIGS. 3 and 4. To complete the dicing of the wafer, radiant energy is applied along a path such that reformed regions 128 are formed within the wafer along the path. In an example embodiment, laser beam 126 is applied along the path. In an example embodiment, laser beam 126 is periodically pulsed along the path. In an example embodiment, a focused infra-red laser is used to produce laser beam 126. An alignment of edge 130 of a radiant energy beam is with respect to desired position 132 for a chip edge, for example, the edge is aligned with the position or at a specified distance from the position. In an example embodiment, edge 130 is an edge of laser beam 126. In an example, embodiment, position 132 is determined with respect to the reference slot. The alignment of the radiant energy beam also is in alignment with the back slot. For example, the alignment of edge 130 and slot 112 is in direction 134 shown in FIG. 3. The wafer is separated along the reformed regions to divide portions of the wafer on either side of the reformed regions, for example, chip 104B and portion 135. The wafer is separated substantially along desired position 132. The separation can be implemented by any means known in the art, for example, using dicing film (not shown) to generate tensile stress. In an example embodiment, the separation includes breaking or cracking the portions of the wafer between the reformed regions. The accuracy of the separation with respect to the desired position is discussed infra.

In an example embodiment, radiant energy is applied along a path such that reformed regions 136 are formed within the wafer along the path. In an example embodiment, laser beam 126 is applied along the path. In an example embodiment, laser beam 126 is periodically pulsed along the path. An alignment of edge 138 of a radiant energy beam is with respect to desired position 140 for a chip edge, for example, the edge is aligned with the position or at a specified distance from the position. In an example embodiment, edge 138 is an edge of laser beam 126. In an example, embodiment, position 140 is determined with respect to the reference slot. The alignment of the radiant energy beam also is in alignment with the back slot. For example, the alignment of edge 138 and slot 112 is in direction 134 shown in FIG. 3. The wafer is separated along the reformed regions to divide portions of the wafer on either side of the reformed regions, for example, chip 104A and portion 135. The wafer is separated substantially along desired position 140. The separation can be implemented by any means known in the art, for example, using dicing film (not shown) to generate tensile stress. In an example embodiment, the separation includes breaking or cracking the portions of the wafer between the reformed regions. The accuracy of the separation with respect to the desired position is discussed infra.

The focal point of the radiant energy is adjusted such that the reformed regions are formed within the wafer. For example, portions of the wafer corresponding to the reformed regions are heated by the radiant energy and then cool down to form the reformed regions. In an example embodiment, the portions of the wafer corresponding to the reformed regions are at least partially liquefied by the radiant energy. The crystalline structure of the wafer is modified within the reformed regions, for example, the crystalline structure is weakened. In an example embodiment, the crystalline structure is substantially eliminated in the reformed regions and the wafer material in the reformed regions is substantially granular, for example, has a sand-like structure. In an example embodiment, the focus of the laser is such that the front and back surfaces of the wafer are not significantly heated or modified by the radiant energy. Therefore, as used herein, a 'reformed region' is any portion of a semiconductor wafer, or of a surface of a semiconductor wafer, that has undergone a molecular-level physical change as a result of being exposed to radiant energy.

Referring to FIGS. 2 through 4, separating the wafer creates end walls 142 for the chips. In an example embodiment, the wafer includes a known reference location, for example a fiducial and the positioning of one or both of positions 132 and 140 is with respect to the fiducial. To produce regions 128 and 136, one or both of the wafer and the laser producing the beam can be displaced.

In an example embodiment, the back slot has width 144 and positions 132 and 140 are separated by width 146 less than width 144. Separating the wafer at least partially separates intact portion 135 from the remainder of the wafer. In an example embodiment, the intact portion includes at least one feature (not shown) used in the fabricating of the wafer, for example, monitor and alignment structures required by the wafer foundry to process the wafers. Portion 135 is not usable for chips 104 due to the presence of the fabricating features noted above, and advantageously, the above process enables the presence of the features for fabricating purposes, while removing the unusable portion for dicing operations.

In an example embodiment, the alignment of edges 130 or 138 with respect to positions 132 and 140, respectively, is determined or adjusted according to thickness 124 of the wafer to account for spread of the respective radiant energy beams. For example, the edges are aligned closer to the positions for a lesser thickness and further from the positions for a greater thickness. This adjustment accounts for the fact that the greater the value of 124, the more the beam will spread orthogonal to direction 134.

Figure 3A:
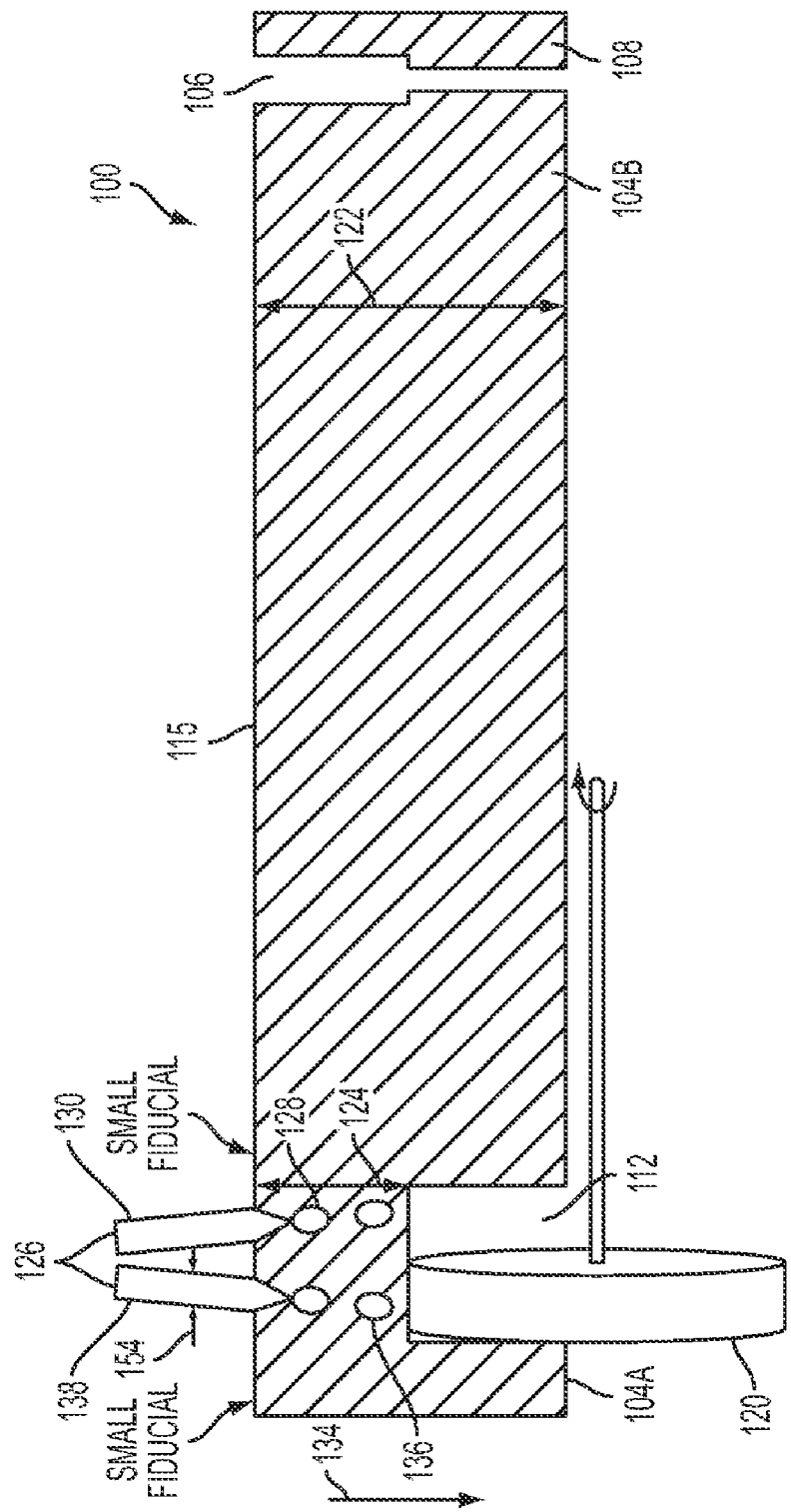
FIG. 3A is a pictorial representation showing dicing of a portion of FIG. 2 using a combination of blade sawing and radiant energy.

FIG. 3A is a pictorial representation showing dicing of a portion of FIG. 2 using a combination of blade sawing and radiant energy. In an example embodiment, regions 128 and 136 are substantially orthogonal to the front surface of the wafer, that is, beam 126 is substantially orthogonal to the front surface to form the reformed regions. In an example embodiment as shown in FIG. 3A, regions 128 and 136 are at an acute angle with respect to front surface 115, that is, beam 126 is substantially at an acute angle with respect to the front surface to form the reformed regions. For example, the cuts taper outward toward the edges of the back slot from positions 132 and 140. This can be advantageous by limiting the portions of butted chips, for example, surfaces 148 of end walls 142 that come into direct contact, to respective portions near surface 115, minimizing possible protrusions or other imperfections in the butted portion that could interfere with the desired tolerance between the butted chips. In an example embodiment, a substantially square corner 150 is formed between the front main surface of the wafer and surfaces, for example, surface 148, formed by separating the wafer.

In an example embodiment, a series of reformed regions are created with respect to positions 132 or 140, that is, an iterative process is used to form a chip edge. For example, a first reformed region is formed at a specified distance from position 132 and then a second reformed region is formed at another specified distance, less than the first specified distance, from position 132. The first reformed region is cracked to form a rough edge and does not need to be as precise and can leave a rougher surface. The second reformed region is cracked substantially along position 132.

Figure 7:
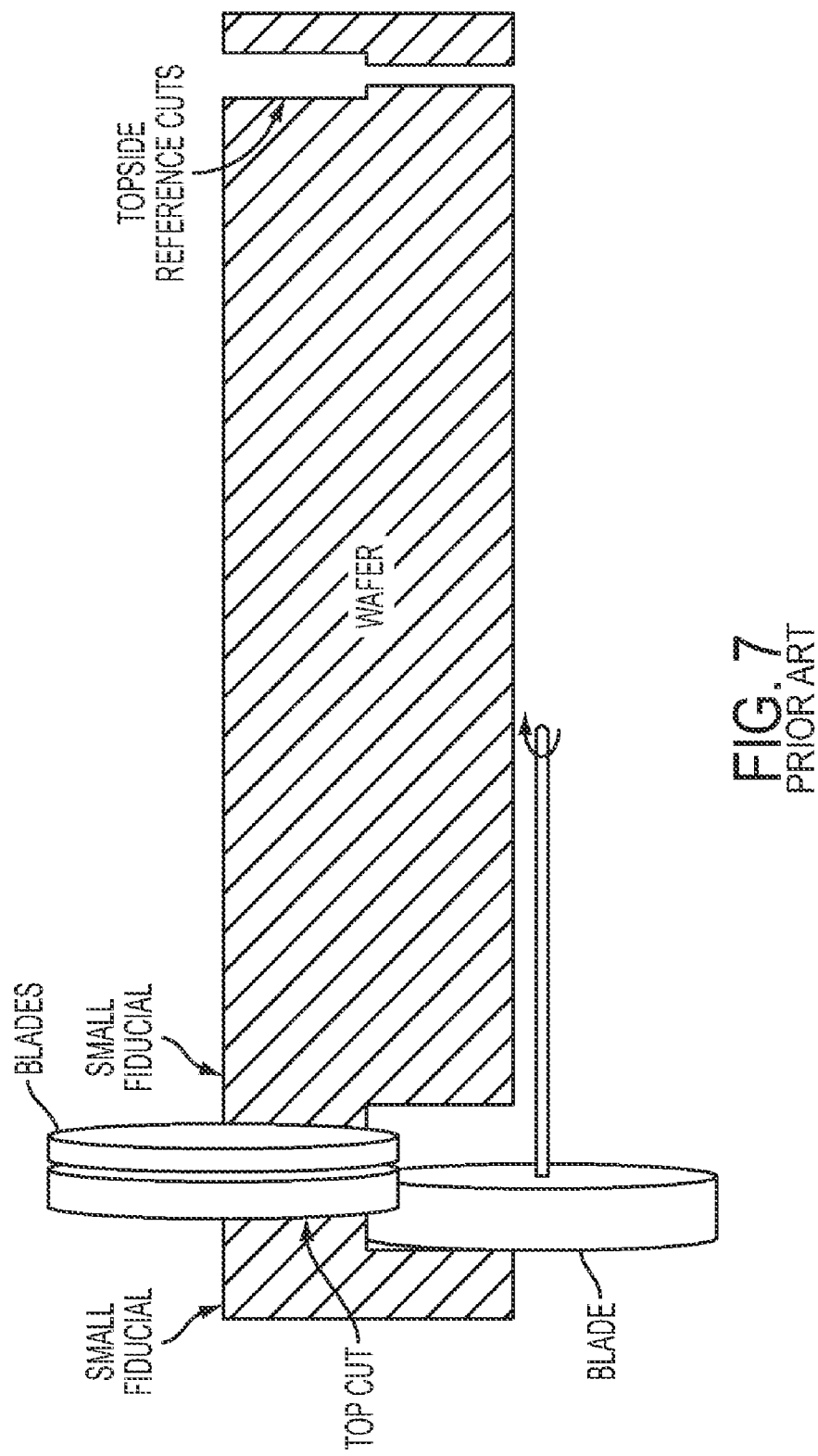
FIG. 7 is a representation of a prior art method of dicing a semiconductor wafer.

It is desirable to locate the end surfaces of a wafer, for example, ends 142, with the greatest degree of precision possible with respect to a known location on the wafer or on the respective chip. The tolerance possible for the location of an end using the process shown in FIG. 7 is about +/−3 microns. Advantageously, the tolerance possible for the location of an end using the process shown in FIGS. 1-4 is about +/−1-2 microns. The increased precision of the edge location enables more precise tolerances between butted chips, which can enable the fabrication of chips or an array of chips, having higher tolerance requirements, for example, enabling higher resolution photosensor chips and arrays.

Figure 5:
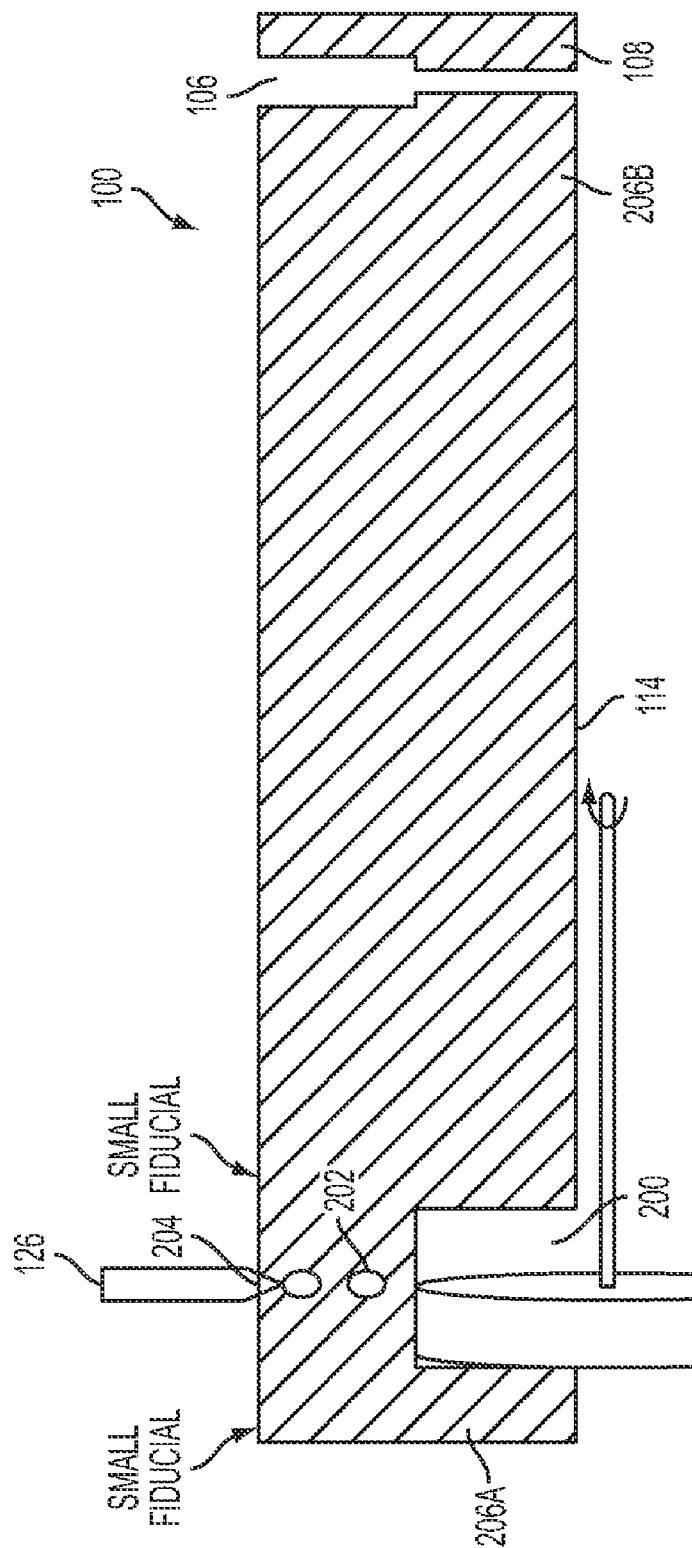
FIG. 5 is a pictorial representation showing dicing of a portion of a semiconductor wafer using a combination of blade sawing and radiant energy.

FIG. 5 is a pictorial representation showing dicing of a portion of wafer 100 using a combination of blade sawing and radiant energy. In an example embodiment, only a single pass of a radiant energy beam, for example, laser beam 126, is used to divide ends of adjoining chips on wafer 100. A reference slot, for example, reference slot 106 is cut in a portion, for example, portion 108, of the wafer outside of the portion of the wafer to be diced into chips. Back slot 200 is cut into back main surface 114 of the wafer in a manner similar to that described supra for back slots 112. Radiant energy is applied along a path such that reformed regions 202 are formed within the wafer along the path. In an example embodiment, laser beam 126 is applied along the path. In an example embodiment, laser beam 126 is periodically pulsed along the path. An alignment of the radiant energy beam is with respect to desired position 204 for a chip edge. In an example, embodiment, position 204 is determined with respect to the reference slot. In an example embodiment, the path is such that the radiant energy beam is substantially centered on desired position 204 for a chip edge, or at least overlaps the desired position. The alignment of the radiant energy beam also is in alignment with the back slot as described supra. The wafer is separated along the reformed regions to divide portions of the wafer on either side of the reformed regions, for example, chips 206A and 206B. The process described for FIG. 5 is applicable to applications in which less precision is required with respect to the location of ends for a chip. For example, a typical tolerance for the location of an end using the process shown in FIG. 5 is about +/−5 microns.

Returning to FIGS. 1-4, in an example embodiment, the process described for FIGS. 1-4 is performed on vertical scribe lines 102 and horizontal scribe lines 152. This would enable the same type blade and radiant energy operations to be used for both vertical and horizontal scribes. In an example embodiment, only a single radiant energy operation, for example, as described for FIG. 5, is used for the vertical or horizontal scribes, for example, in applications in which edge definition or precision is not as important. For example, typically edge definition along the length of a chip is less important than for the "butted" ends of the chip. However, it is possible that in some applications, a single laser cut along a vertical scribe line is sufficiently precise.

The use of at least two radiant energy operations, for example, to generate two sets of reformed regions, to dice respective portions of wafer 100, for example, as described for FIGS. 1-4, has at least the following advantages:

1) Any width scribe line 102 can be used as needed for process controls, while still allowing the chips to be cut precisely to the length needed without any extra edge material that would prevent precise butting. That is, the process accounts for and removes the unwanted edge material;
2) Independent of width 154 of the radiant energy beam, the edge of a chip, such as at corner 150, can be placed exactly at the respective desired locations for each of adjacent chips at any depth in the silicon;
3) The alignment of the radiant energy beam can be adjusted, for example, with respect to position 132 or 140, for different thicknesses 124 to account for any "spread" of the beam, something that is not possible with a single radiant energy operation (a single pass of the radiant energy beam along a path as described in FIG. 5 because of encroachment on the adjacent chip;
4) More than two radiant energy operations per chip edge could be used for "rough" cutting and then "fine" cutting. The rough cut would take off most of the material, but not be as close to precise edge.

Figure 6:
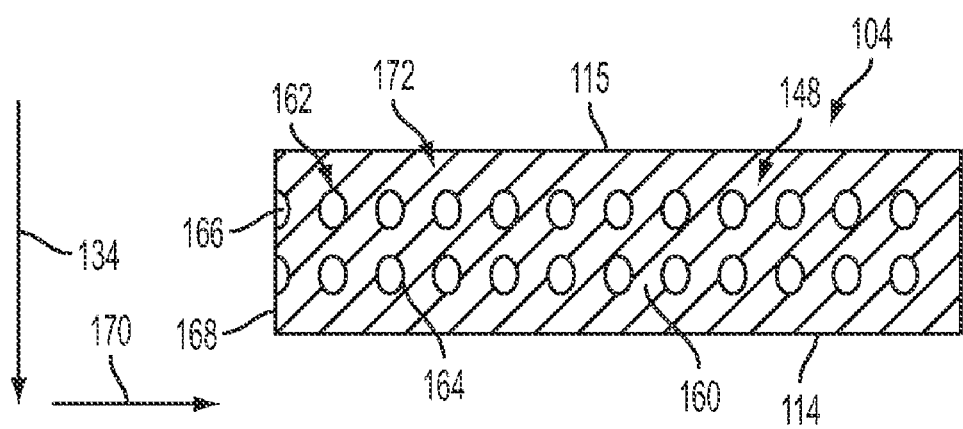
FIG. 6 is an end view of a chip diced from a wafer using a combination of blade sawing and radiant energy.

FIG. 6 is an end view of a chip diced from a wafer using a combination of blade sawing and radiant energy. In an example, embodiment, the chip shown in FIG. 6 is chip 104 from FIGS. 2-4 or chip 206 shown in FIG. 5. Chip 104 is shown in FIG. 6 and described below. It should be understood that FIG. 6 is applicable to any chip formed by a combination of blade sawing and radiant energy. Chip 104 includes front and back main surfaces 115 and 114, respectively, and end surface 148 formed between the front and back main surfaces. The end surface includes substantially planar portion 160 in communication with the front and back surfaces and a plurality of indentations 162. In an example embodiment, the indentations are periodically spaced and substantially equally sized. In an example embodiment, the indentations are substantially equally spaced.

The indentations correspond to reformed regions 128 or 136 and the planar portion corresponds to the portion of the wafer that surrounds the reformed regions. In an example embodiment, the wafer material in reformed regions 128 or 136 has a granular, sand-like structure and when the wafer is separated, the reformed regions are exposed and material in the reformed regions falls out of the wafer or is easily displaced from the wafer, leaving behind indentations in the end surface. In an example embodiment, circumference 164 for each indentation is fully surrounded by the planar portion. In an example embodiment (not shown), one or more of indentations 162 are in communication with one or both of the front and back surfaces, that is, the indentation are open to one or both of the front and back surfaces. In an example embodiment, indentations 166 are in communication with vertical edge 168, that is, the indentation are open to the edge.

In an example embodiment (not shown), indentations 162 are in the form of a series of single indentations spaced apart in direction 170. That is, the indentations do not overlap or are not in alignment in direction 134. In an example embodiment, these indentations 162 are equally spaced apart in direction 170.

In an example embodiment, indentations 162 are in the form of groups 172 of indentations spaced apart in direction 170. Each group 172 includes two or more indentations 162 substantially aligned in direction 134. Although two indentions are shown per group in FIG. 6, it should be understood that groups 172 can include other numbers of indentations. In an example embodiment, each group 172 includes the same number of indentations. In an example embodiment, indentations in the groups are equally placed with respect to the front and back surfaces of the wafer and are equally spaced apart in direction 134. In an example embodiment, groups 172 are equally spaced apart in direction 170.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What we claim is:

1. A method for dicing a semiconductor wafer, comprising:
    cutting a reference slot in a back main surface of the wafer;
    cutting a back slot in the back main surface of the wafer, the back slot positioned with respect to the reference slot;
    determining a desired location for a first chip edge with respect to the reference slot;
    applying, using a radiant energy source, radiant energy in a first path such that a first series of reformed regions are formed within the wafer along the first path, wherein:
        a crystalline structure of the wafer is modified in the first series of reformed regions; and,
        a location of a first edge of the radiant energy source is:
            with respect to the desired location for the first chip edge; and,
            in alignment with the back slot; and,
    separating the wafer along the first series of reformed regions to divide portions of the wafer on either side of the first series of reformed regions.

2. The method of claim 1 wherein applying radiant energy includes applying a laser.

3. The method of claim 1, further comprising:
    applying radiant energy in a second path such that a second series of reformed regions are formed within the wafer along the second path, wherein:
        the crystalline structure of the wafer is modified in the second series of reformed regions; and,
        an alignment of a second edge of the laser is:
            with respect to the desired location for the second chip edge; and,
            in alignment with the back slot; and,
    separating the wafer along the second series of reformed regions to divide portions of the wafer on either side of the second series of reformed regions.

4. The method of claim 3 wherein the back slot has a first width and the first and second paths are separated by a second width less than the first width.

5. The method of claim 3 wherein a region of the wafer between the first and second series of reformed regions includes at least one feature used in the fabrication of the wafer.

6. The method of claim 1 wherein determining the desired location for a first chip edge with respect to the reference slot includes aligning the first edge with the desired location for the first chip edge.

7. The method of claim 1 wherein:
    the back slot includes a slot surface substantially parallel to the front main surface;
    the wafer has a thickness between the front main surface and the slot surface; and,
    wherein determining a desired location for a first chip edge with respect to the reference slot includes positioning the first edge according to the thickness.

8. The method of claim 7 wherein positioning the first edge according to the thickness includes:
positioning the first edge at a first distance from the desired location for the first chip edge for a thickness having a first value; and,
positioning the first edge at a second distance, greater than the first distance, from the desired location for the first chip edge for a thickness having a second value greater than the first value.

9. The method of claim 1 wherein applying radiant energy in the first path such that the first series of reformed regions are formed within the wafer includes forming the first series of reformed regions substantially orthogonal to a front main surface of the wafer.

10. The method of claim 1 wherein applying radiant energy in the first path such that the first series of reformed regions are formed within the wafer includes forming the first series of reformed regions at an acute angle with respect to the front main surface of the wafer.

11. The method of claim 1 wherein separating the wafer along the first series of reformed regions includes:
forming an end surface on the die between the front and back main surfaces; and,
forming a substantially square corner between the front main surface and at least a portion of the end surface on the die.

12. The method of claim 1 wherein the position of the first edge of the laser with respect to the desired location for the first chip edge includes a position of the first edge at a first distance from the desired location for the first chip edge; and,
the method further comprising applying radiant energy in a second path such that a second series of reformed regions are formed within the wafer along the second path, a position of the first edge of the laser at a second distance, less than the first distance, from the desired location for the first chip edge.

13. A method for dicing a semiconductor wafer, comprising:
cutting a reference slot in a back main surface of the wafer;
cutting a back slot in the back main surface of the wafer, the back slot positioned with respect to the reference slot;
determining a desired location for a first chip edge with respect to the reference slot;
applying, using a radiant energy source, radiant energy in a first path such that a first series of reformed regions are formed within the wafer along the first path, wherein:
a crystalline structure of the wafer is modified in the first series of reformed regions; and,
an alignment of a first edge of the radiant energy source is:
with respect to the desired location for the first chip edge; and,
in alignment with the back slot;
determining a desired location for a second chip edge with respect to the reference slot;
applying radiant energy in a second path such that a second series of reformed regions are formed within the wafer along the second path, wherein:
the crystalline structure of the wafer is modified in the second series of reformed regions; and,
an alignment of a second edge of the laser is:
with respect to the desired location for the second chip edge; and,
in alignment with the back slot; and,
separating the wafer along the first and second series of reformed regions to divide portions of the wafer on either side of the first and second series of reformed regions.

14. A method for dicing a semiconductor wafer, comprising:
cutting a reference slot in a back main surface of the wafer;
cutting a back slot in the back main surface of the wafer, the back slot positioned with respect to the reference slot;
determining a desired location for a chip edge with respect to the reference slot;
applying, using a radiant energy source, radiant energy in a path such that a series of reformed regions are formed within the wafer along the path, wherein:
a crystalline structure of the wafer is modified in the reformed regions; and,
an alignment of an edge of the radiant energy source is with respect to the desired location for the chip edge; and,
separating the wafer along the series of reformed regions to divide portions of the wafer on either side of the series of reformed regions, wherein applying radiant energy in the first path such that the first series of reformed regions are formed within the wafer includes forming the first series of reformed regions at an acute angle with respect to the front main surface of the wafer.

* * * * *